(12) United States Patent
Lin et al.

(10) Patent No.: US 7,075,132 B1
(45) Date of Patent: Jul. 11, 2006

(54) PROGRAMMABLE JUNCTION FIELD EFFECT TRANSISTOR AND METHOD FOR PROGRAMMING THE SAME

(75) Inventors: Chong Ming Lin, Sunnyvale, CA (US); Ho Yuan Yu, Saratoga, CA (US)

(73) Assignee: Lovoltech, Inc., Santa Clara, CA (US)

( * ) Notice: Subject to any disclaimer, the term of this patent is extended or adjusted under 35 U.S.C. 154(b) by 36 days.

(21) Appl. No.: 10/335,403

(22) Filed: Dec. 30, 2002

(51) Int. Cl.
*H01L 29/80* (2006.01)

(52) U.S. Cl. ............... 257/256; 257/262; 257/263; 257/270; 257/329; 257/134

(58) Field of Classification Search ............ 257/256, 257/134, 135, 136, 262, 263, 270, 272, 329
See application file for complete search history.

(56) References Cited

U.S. PATENT DOCUMENTS

| | | | |
|---|---|---|---|
| 3,381,188 A | 4/1968 | Zuleeg et al. | 317/235 |
| 4,404,575 A | 9/1983 | Nishizawa | 357/22 |
| 4,419,586 A | 12/1983 | Phipps | 250/551 |
| 4,506,282 A | 3/1985 | Baliga | 357/43 |
| 4,519,024 A | 5/1985 | Federico et al. | 363/127 |
| 4,523,111 A | 6/1985 | Baliga | 307/574 |
| 4,645,957 A | 2/1987 | Baliga | 307/570 |
| 4,700,461 A | 10/1987 | Choi et al. | 437/41 |
| 4,750,023 A | 6/1988 | Shannon | 357/23.3 |
| 4,769,685 A | 9/1988 | MacIver et al. | 357/23.4 |
| 4,835,586 A * | 5/1989 | Cogan et al. | 257/260 |
| 4,853,561 A | 8/1989 | Gravrok | 307/443 |
| 5,038,266 A | 8/1991 | Callen et al. | 363/89 |
| 5,396,085 A | 3/1995 | Baliga | 257/77 |
| 5,945,699 A | 8/1999 | Young | 257/256 |
| 6,011,703 A | 1/2000 | Boylan et al. | 363/21 |
| 6,028,778 A | 2/2000 | Amano | 363/40 |
| 6,064,580 A | 5/2000 | Watanabe et al. | 363/17 |
| 6,069,809 A | 5/2000 | Inoshita | 363/98 |
| 6,084,792 A | 7/2000 | Chen et al. | 363/127 |
| 6,090,650 A | 7/2000 | Dabrai et al. | 438/195 |
| 6,104,172 A | 8/2000 | Josephs et al. | 323/222 |
| 6,107,649 A * | 8/2000 | Zhao | 257/138 |
| 6,180,519 B1 | 1/2001 | Kuroi et al. | 438/649 |
| 6,236,257 B1 | 5/2001 | Si et al. | 327/379 |
| 6,251,716 B1 | 6/2001 | Yu | 438/186 |
| 6,281,705 B1 | 8/2001 | Yu | 326/68 |
| 6,304,007 B1 | 10/2001 | Yu | 307/110 |
| 6,307,223 B1 | 10/2001 | Yu | 257/256 |
| 6,349,047 B1 | 2/2002 | Yu | 363/127 |
| 6,355,513 B1 | 3/2002 | Yu | 438/186 |
| 6,356,059 B1 | 3/2002 | Yu | 323/223 |
| 6,404,157 B1 | 6/2002 | Simon | 318/445 |
| 6,423,986 B1 * | 7/2002 | Zhao | 257/138 |
| 6,439,678 B1 | 8/2002 | Norton | 347/9 |

OTHER PUBLICATIONS

Kang et al.; "A New Type of Transistor: CBT"; IEEE Transactions on Electron Devices; vol. 40; #10; Oct. 1993.

(Continued)

*Primary Examiner*—Nathan J. Flynn
*Assistant Examiner*—Remmon R. Fordé
(74) *Attorney, Agent, or Firm*—Wagner, Murabito & Hao LLP

(57) ABSTRACT

A programmable junction field effect transistor (JFET) with multiple independent gate inputs. A drain, source and a plurality of gate regions for controlling a conductive channel between the source and drain are fabricated in a semiconductor substrate. A first portion the gate regions are coupled to a first gate input and a second portion of the gate regions are coupled to a second gate input. The first and second gate inputs are electrically isolated from each other. The JFET may be programmed by applying a programming voltage to the first gate input and operated by applying a signal to the second gate input.

10 Claims, 13 Drawing Sheets

OTHER PUBLICATIONS

"N–Channel Enhancement–Mode MOSFET Transistors"; 2N6660JAN/JANTX/JANTXV; Product Summary; Siliconix; P–37515–Rev. A, Jul. 4, 1994.

General Semiconductor; GF2208; "N–Channel Enhancement–Mode MOSFET"; Jul. 10, 2001.

International Rectifier; IRF1205; HEXFET Power MOSFET; Nov. 3, 1999.

"N–Channel 30V–0.034Ω–22A D2PAK STRIPFET Power MOSFET"; STB22NE03L: Preliminary Data; 6 pgs.; Nov. 2000.

"N–Channel Enhancement–Mode MOSFET Transistors"; 2N66601/VN88AFD; Product Summary; Siliconix; P–37655–Rev. B, Jul. 25, 1994.

Central Semiconductor Corp.; CMPF4391, CMPF4392, CMPF4393, N–Channel JFET; Product Summary.

Fairchild Semiconductor Corporation; "N–Channel/Logic Level Enhancement Mode Field Effect Transistor"; FDP6030L/FDB6030L; Apr. 1998.

Philips Semiconductors; "POWERMOS Transistor"; BUK463–60A/B; Product Specification; Jul. 1995.

H. Ogiwara, M. Hayakawa, T. Nishimura and M. Nakaoka; "High–Frequency Induction Heating Inverter with Multi–Resonant Mode Using Newly Developed Normally–Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017–1023.

J. Baliga; "Highvoltage Junction–Gate Field Effect Transistor with Recessed Gates"; IEEE Transactions on Electron Devices; vol. ED–29; No. 10; Oct. 1982.

J. M. C. Stork et al.; "Small Geometry Depleted Base Bipolar Transistors (BSIT)–VLSI Devices?"; IEEE Transactions on Electron Devices; vol. ED–28; No. 11. Nov. 1981.

Nishiwaza et al.; "Analysis of Static Characteristics of a Bipolar Mode SIT (BSIT)"; IEEE Transactions on Electron Devices; vol. ED–29; No. 11; Aug. 1982.

Caruso et al.; "Performance Analysis of a Bipolar Mode FET (BMFET) with Normally Off Characteristics"; IEEE Transactions on Power Electronics; vol. 3; No. 2; Apr. 1988.

Nishiwaza et al.; "Fieldeffect Transistor Versus Analog Transistor (Static Induction Transistor)"; IEEE Transactions on Electron Devices; vol. ED–24; No. 4; Apr. 1975.

* cited by examiner

PROGRAMMABLE JUNCTION FIELD EFFECT TRANSISTOR AND METHOD FOR PROGRAMMING THE SAME

FIELD OF THE INVENTION

Embodiments of the present invention relate to the field of semiconductor devices. In particular, embodiments of the present invention relate to junction field effect transistors (JFETs).

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices.

The most common JFET type is the depletion mode type. The depletion mode device is a "normally on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$ can be relatively high. However, the supply voltage between the drain and source ($V_{ds}$) is usually relatively low.

Prior Art FIG. 1 shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions.

In operation, the voltage variable width of the depletion regions 13 is used to control the effective cross-sectional area of the conductive channel region 14. The application of a voltage $V_{gs}$ between the gates 10 and source 12 will cause the conductive channel region 14 to vary in width, thereby controlling the resistance between the drain 11 and the source 12. A reverse bias, (e.g., a negative $V_{gs}$), will cause the depletion regions 13 to expand, and at a sufficiently negative value cause the conductive channel 14 to "pinch off", thereby turning off the device.

The width of the depletion regions 13 and the conductive channel region 14 are determined by the width of the n-doped region and the dopant levels in the n-doped and p-doped regions. If the device shown in FIG. 1 were constructed with a narrow n-doped region, such that the two depletion regions 13 merged into a single continuous depletion region and the conductive channel region 14 had zero width, the result would be the device shown in FIG. 2.

Enhancement mode, or "normally off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input voltage of an enhancement mode JFET is limited by the forward voltage of the p-n junction.

Prior Art FIG. 2 shows a general schematic of an n-channel enhancement mode JFET with $V_{gs}=V_{ds}=0$. The enhancement mode device is "normally off" since the conductive channel width is zero due to the extent of the two depletion regions 13B. The application of a sufficient forward bias (e.g. positive $V_{gs}$) to the device of FIG. 2 will cause the depletion regions 13B to contract, thereby opening a conductive channel.

Although the depletion mode and enhancement mode devices shown schematically in FIG. 1 and FIG. 2 are n-channel devices, depletion mode and enhancement mode devices could be constructed with a reversed doping scheme to provide p-channel devices.

Historically, JFETs have been designed and manufactured with a single gate lead or gate input. Although prior art JFET devices may have more than one gate region associated with control of a conductive channel between source and drain, the gate regions are connected to a common input.

As with other transistor types, the operating characteristics of a JFET may be represented by a family of I-V curves corresponding to a set of inputs, e.g., drain current ($I_d$) versus drain/source voltage ($V_{ds}$) for different values of gate voltage ($V_{gs}$).

The operational characteristics of a JFET are typically determined by the geometric relationship between the gate, source and drain elements, and the doping profile in the substrate in which the JFET is fabricated. Devices may be fabricated with a wide range of characteristics, but operating parameters of a given device are essentially fixed.

In contrast to JFETs, metal-oxide semiconductor field effect transistors (MOSFETs) have been fabricated with multiple gate inputs that enable the fundamental operating characteristics of the MOSFET to be adjusted. For example, a DC voltage may be applied to one gate of a dual-gate MOSFET to shift the threshold voltage, or on resistance, of the device, with the other gate receiving the signal input.

MOSFETs have been more widely used than JFETs, and the fabrication processes for MOSFETs have been relatively more advanced than those used for JFETs. However, the adoption of submicron processes for device fabrication and the resulting higher speeds, lower voltages, and greater current demands in integrated circuits has created new opportunities for the application of JFETs.

JFETs are capable of being driven by low voltages while maintaining excellent breakdown characteristics when compared to MOSFETs. Since there is no insulator associated with gate/drain and gate/source interfaces of a JFET (only a p-n junction), forward bias results in conduction at voltages that are very low compared to the reverse bias that the device is capable of withstanding. JFETs also have a much greater resistance to damage from electrostatic discharge (ESD) than MOSFETs.

An obstacle to the adoption of JFETs for use in logic and power devices is a lack of precise control over process, voltage and temperature variations of conventional JFETS.

SUMMARY OF INVENTION

Accordingly, embodiments of a programmable JFET that allow fine tuning of the conductive channel within the JFET through the use of multiple gate inputs are described herein. The additional gate inputs provide for tailoring of the device characteristics by the application of a programming voltage.

A programmable junction field effect transistor (JFET) with multiple independent gate inputs is disclosed. A drain, source and a plurality of gate regions for controlling a conductive channel between the source and drain are fabricated in a semiconductor substrate. In one embodiment, a first portion of the gate regions are coupled to a first gate input and a second portion of the gate regions are coupled to a second gate input. The first and second gate inputs are electrically isolated from each other. The JFET may be programmed by applying a programming voltage to the first gate input and operated by applying a signal to the second gate input.

In an embodiment of the present invention, adjacent trenches are formed in the top surface of a semiconductor substrate and a drain contact is formed on the surface of the region separating the two trenches. A source contact is formed on the bottom surface of the substrate. Three gate regions are implanted in the bottom of each trench. A gate lead is coupled to a gate region in each trench to produce electrically independent pairs of gate regions that are each capable of modifying the conductive channel between the drain and source.

In a further embodiment, a first pair of trenches are formed in the top surface of a semiconductor substrate and a drain contact is formed on the surface of the region separating the two trenches. A source contact is formed on the bottom surface of the substrate. Two gate regions are implanted in the bottom of the first pair of trenches. A gate lead is coupled to a gate region in each trench to produce electrically independent pairs of gate regions. A second pair of trenches is formed in the bottom of the first pair of trenches and a gate region is formed in the bottom of each trench of the second pair. A gate lead is coupled to each of the gate regions in the second trench pair.

BRIEF DESCRIPTION OF THE DRAWINGS

Prior Art

Prior Art

DESCRIPTION OF THE PREFERRED EMBODIMENTS

In the following detailed description of the present invention, a programmable junction field effect transistor and method for programming same, numerous specific details are set forth in order to provide a thorough understanding of the present invention. However, it will be obvious to one skilled in the art that the present invention may be practiced without these specific details. In other instances well known circuits, components, interconnects and processes have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference. The referenced patent describes material regarding an enhancement mode JFET with a gate grid array structure.

U.S. patent applications Ser. No. 10/158,326, "Method and Structure for Reduced Gate Capacitance," (filed May 29, 2002) and Ser. No. 10/191,030 "Method and Structure for Double Dose Gate in a JFET," (filed Jul. 7, 2002), are assigned to the assignee of the present invention and describe gate structures and methods of fabricating same. Both applications are hereby incorporated herein by reference.

Figure 1:
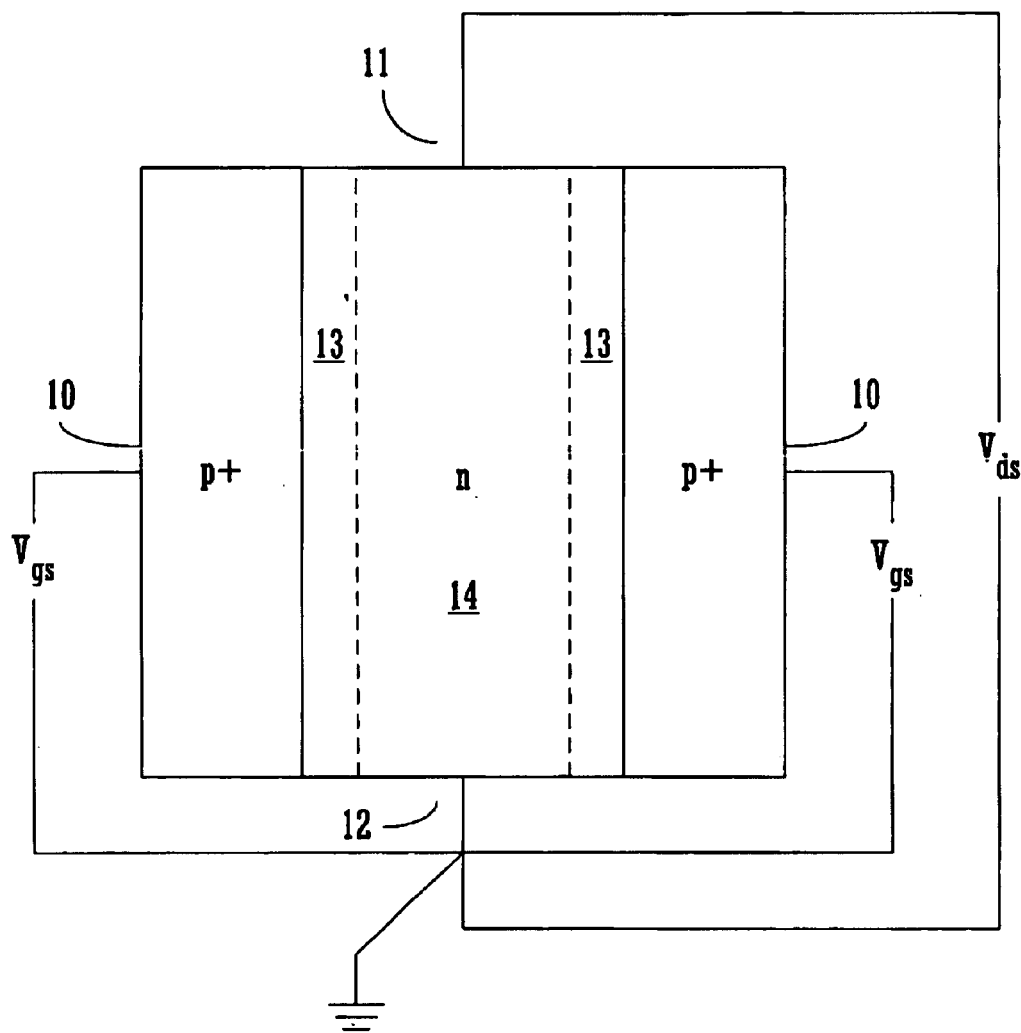
FIG. 1 shows a general schematic for a conventional n-channel depletion mode junction field effect transistor (JFET).
Figure 2:
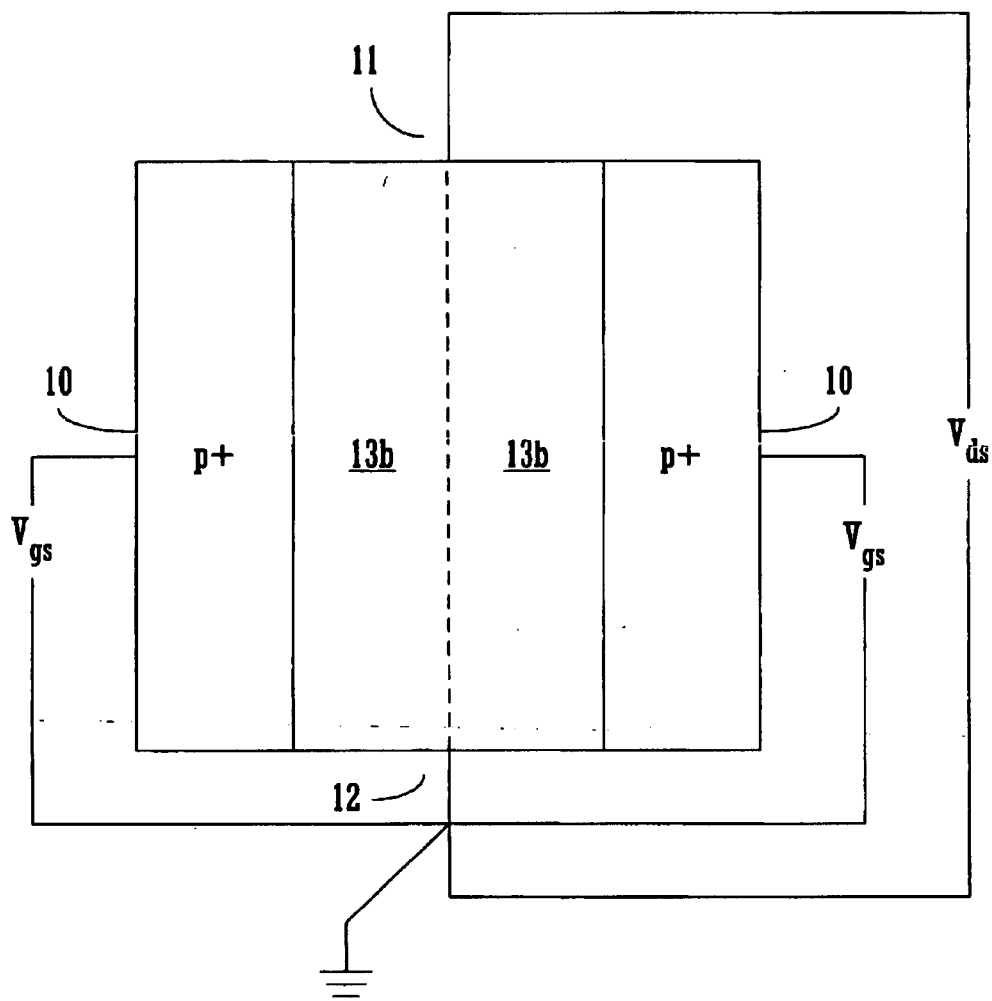
FIG. 2 shows a general schematic for a conventional n-channel enhancement mode junction field effect transistor (JFET).
Figure 3:
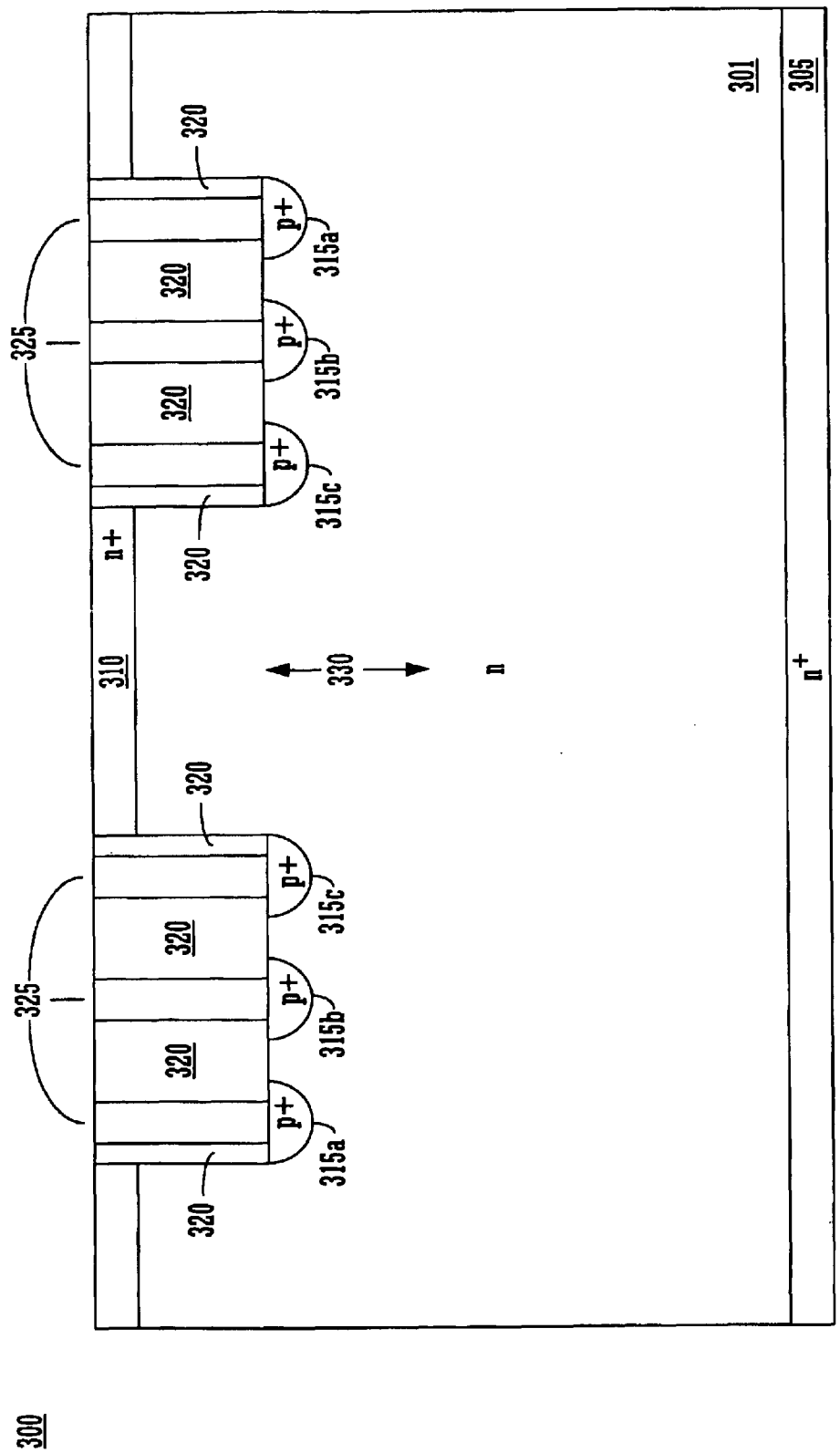
FIG. 3 shows a single-level trench programmable junction field effect transistor (JFET) in accordance with an embodiment of the present claimed invention.

FIG. 3 shows a single-level trench programmable junction field effect transistor (JFET) 300. In this embodiment, an n-type substrate 301 has a drain contact 310 formed on its top surface and a source contact 305 formed on its bottom surface. The region of the substrate 301 between the drain 310 and the source 305 forms a conductive channel 330.

In proximity to the channel 330 are gate regions 315a, 315b, and 315c. The gate regions are complementary to the substrate 301, that is if the substrate is n-type the gate regions are p-type, and vice versa. The gate regions are preferably formed by ion implantation. The gate regions are coupled to vias 325, enabling interconnects to be made at the surface of the device. A dielectric 320 isolates the vias 325.

Each gate region (315a, 315b, and 315c) has an associated p-n junction at the interface to the substrate 301, and each junction has a depletion region that may be expanded or contracted by biasing the junction.

For a given set of gate regions, many different interconnect schemes may be used. Corresponding gate regions 315a, 315b and 315c may be electrically coupled inherently, e.g., gate region 315a as a ring structure. The corresponding gate regions may also be discontinuous within the substrate 301, but coupled by an interconnect scheme (not shown) connected to the vias 325.

Figure 8:
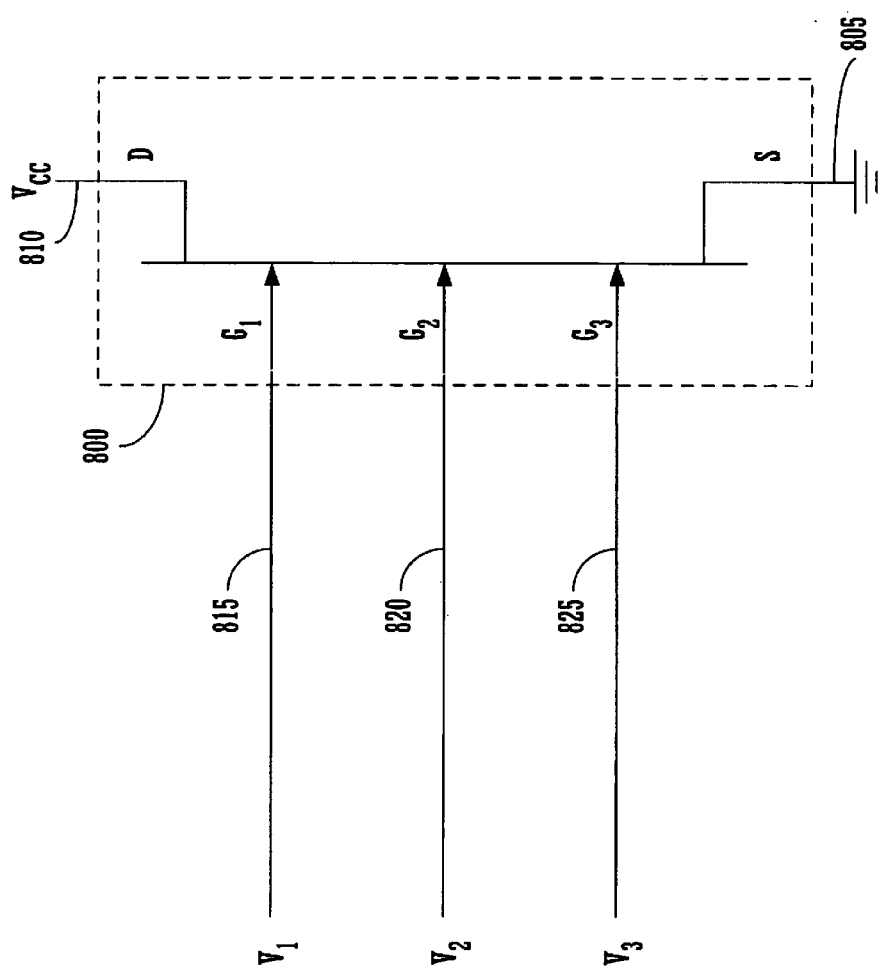
FIG. 8 shows a schematic for a programmable junction field effect transistor (JFET) with three electrically independent gate leads in accordance with an embodiment of the present claimed invention.

In the example of FIG. 3, gates 315a, 315b and 315c may each be coupled to a gate lead (as shown schematically in FIG. 8). Thus, a voltage applied to each gate will independently modify the conductive channel 330. Gate 315c is closest to the channel 330, and will have the greatest influence at a given bias, whereas gate 315a is the farthest from the channel 330 and will have the smallest influence.

The JFET 300 of FIG. 3 is referred to as programmable because one of the gates is used as a signal input, whereas the remaining (programming) gates may be biased in order to adjust the operational characteristics of the JFET 300. Since the geometry of the conduction channel 330 is determined by a superposition of the depletion regions of all three gates, the JFET 300 may be programmed by applying a DC bias to one or both of the programming inputs. In order to be programmable, a JFET must have at least two independent gates, but may have more as shown in FIG. 3.

It is important to note that for a device having a trench and channel width on the order of 0.5 micron or larger, gate 315c will dominate the overall device behavior and the influence of gate 315b will be small, with the influence of gate 315a being smaller still. However, as the critical dimensions shrink and the device scale decreases, the influence of gate 315b and 315a will increase. This is due to the fact that the depletion region dimension width is primarily a function of doping and junction bias.

Figure 4:
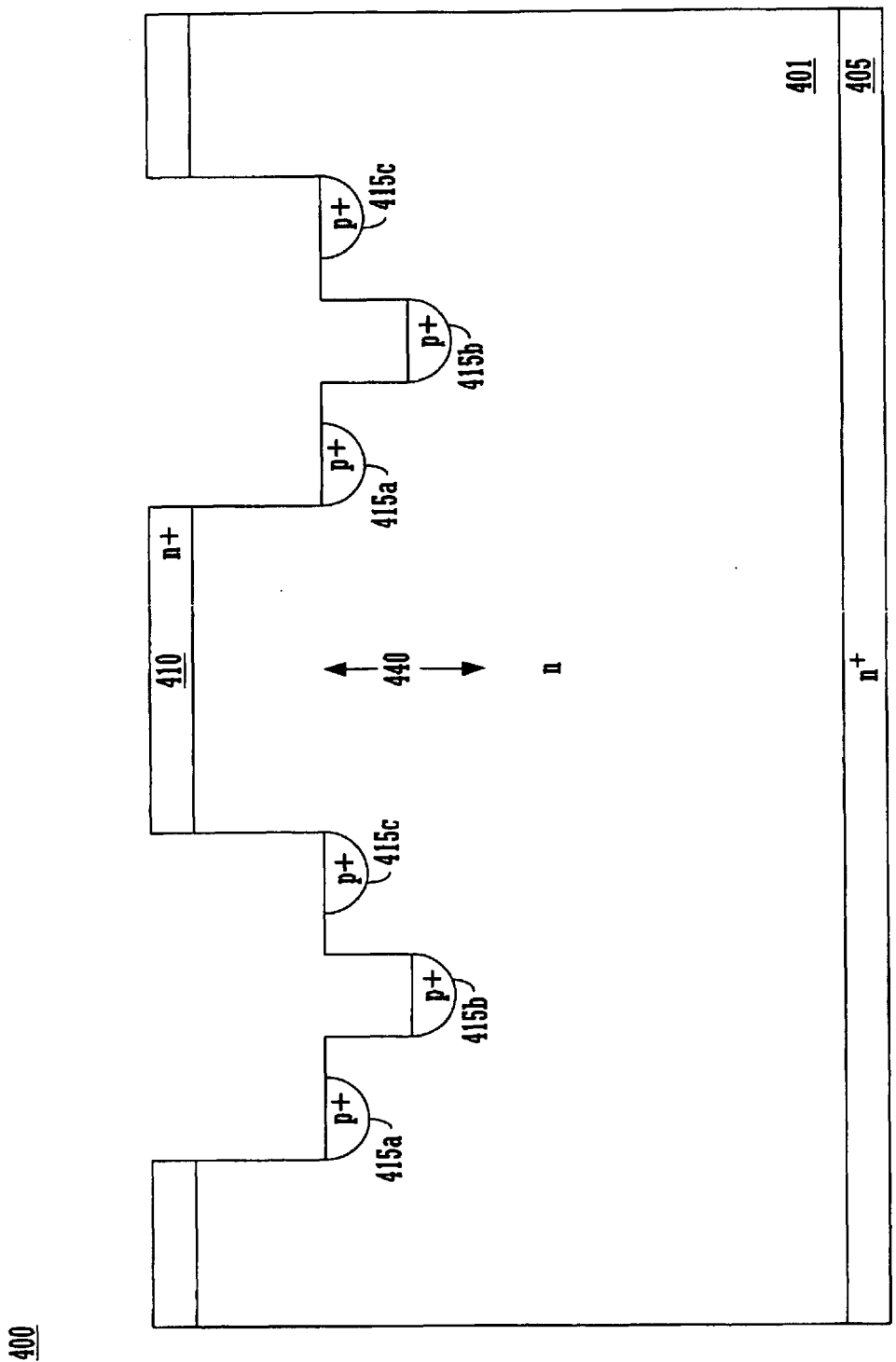
FIG. 4 shows a dual-level trench programmable junction field effect transistor (JFET) in accordance with an embodiment of the present claimed invention.

FIG. 4 shows another programmable JFET embodiment 400 that is similar to the JFET 300 of FIG. 3. Substrate 401, drain 410, source 405, gate 415a, and gate 415c are essentially the same as substrate 301, drain 310, source 305, gate 315a, and gate 315c. However, gate 415b differs from gate 315b in that it has been formed in the bottom of a second trench located in the bottom of the first trench. This modification of the spatial relationship between the gates is reflected in the response of the JFET 400 to voltages applied to the gates, and also results in a modified channel 440.

The influence of gate 415b is proportionally greater than that of gate 315b, and the influence of gate 415c is proportionally smaller than that of gate 315C. When using a dual-level trench as shown in FIG. 4, gate 415c may be omitted, with either gate 415a or 415b serving as a signal input or a programming input.

Figure 5:
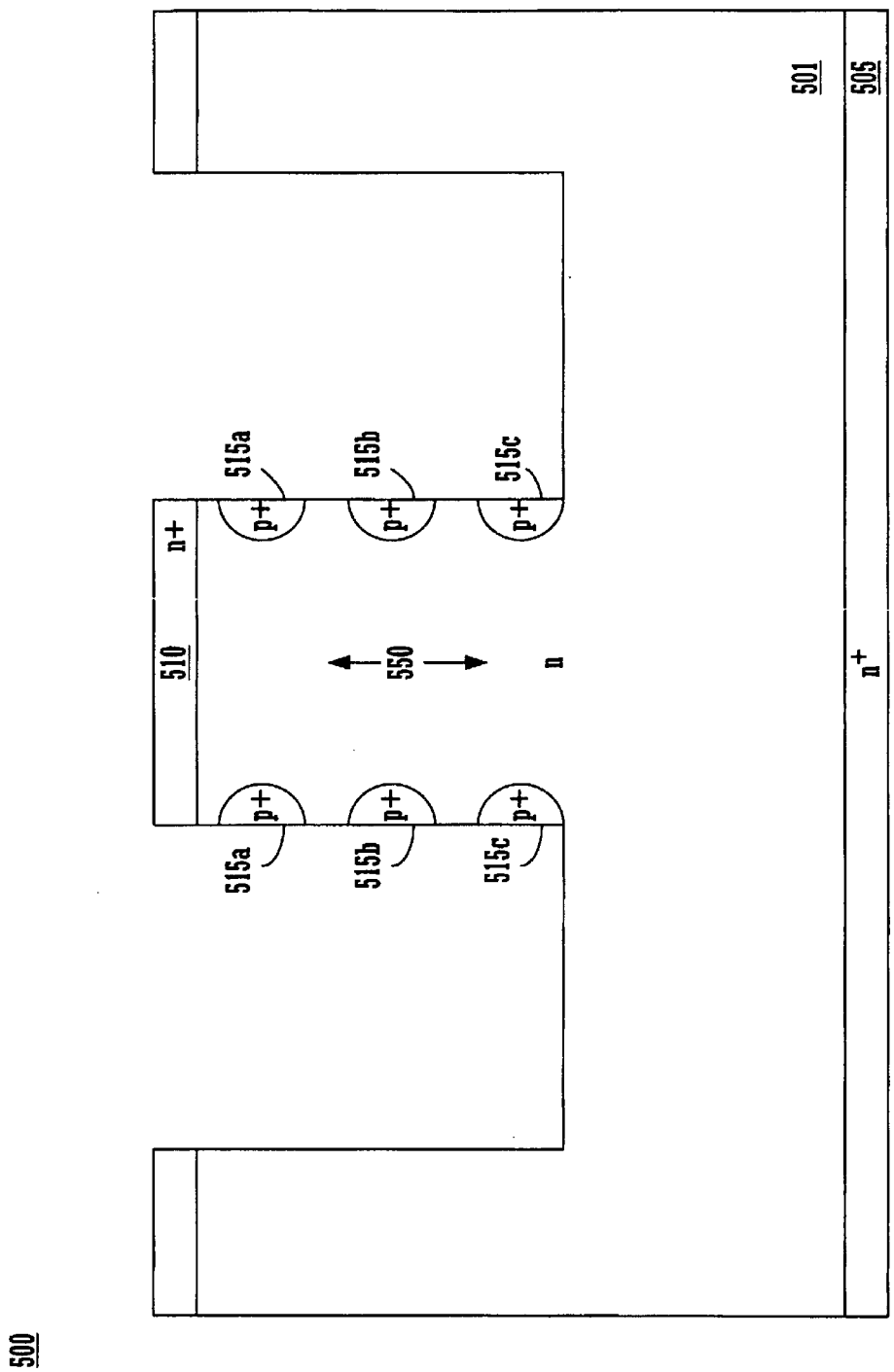
FIG. 5 shows a single-level trench programmable junction field effect transistor (JFET) with sidewall gate regions in accordance with an embodiment of the present claimed invention.

FIG. 5 shows a single-level trench programmable junction field effect transistor (JFET) 500 with sidewall gate regions 515a, 515b, and 515c. The substrate 501, source 505, and drain 510 are similar to the substrate 301, source 305, and drain 310 of FIG. 3. However, gate regions 515a, 515b, and 515c are formed in a sidewall of the trench instead of the bottom. Each of gates 515a, 515b, and 515c may be independently operative to pinch off the channel 550 and to turn the JFET 500 off. For the JFET of FIG. 3 or FIG. 4, only one gate will typically be able to turn the JFET off independently.

Figure 6A:
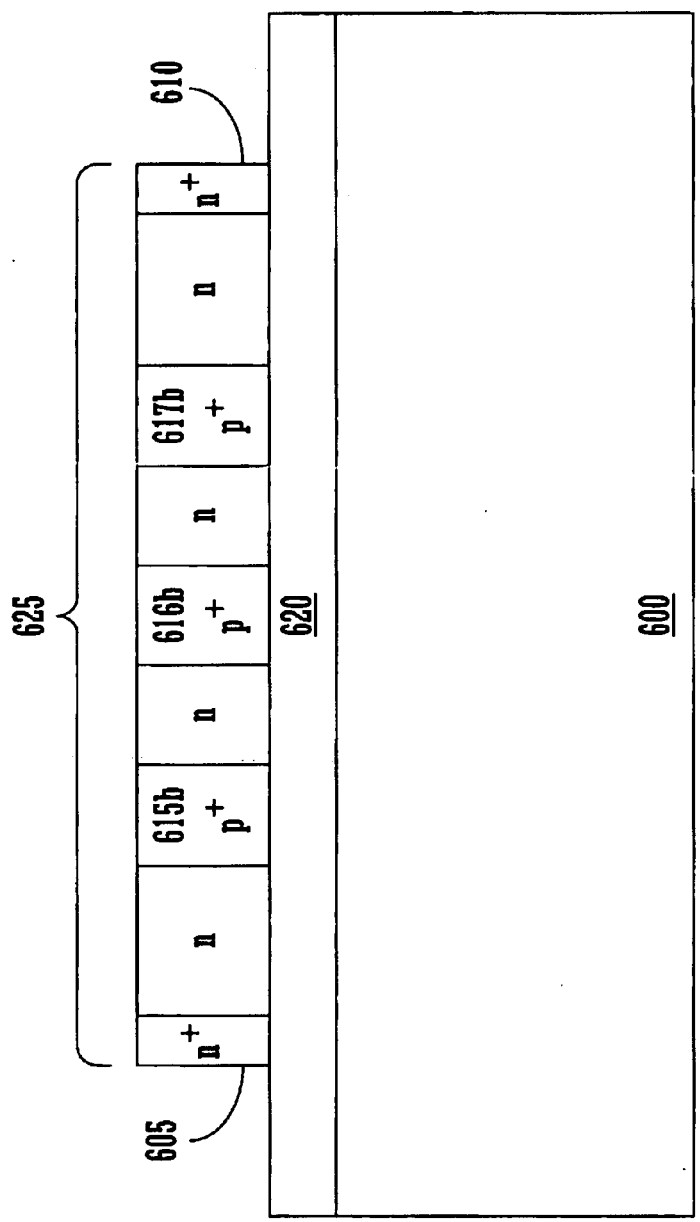
FIG. 6A shows a side view of a horizontal split gate programmable junction field effect transistor (JFET) fabricated on a silicon-on-insulator (SOI) substrate in accordance with an embodiment of the present claimed invention.

FIG. 6A shows a side view of a horizontal split gate programmable junction field effect transistor (JFET) 625 fabricated on a silicon-on-insulator (SOI) substrate 600. A dielectric layer 620 electrically isolates the horizontal JFET 625 from the substrate 600. The JFET 625 has a drain 610 and a source 605.

Figure 6B:
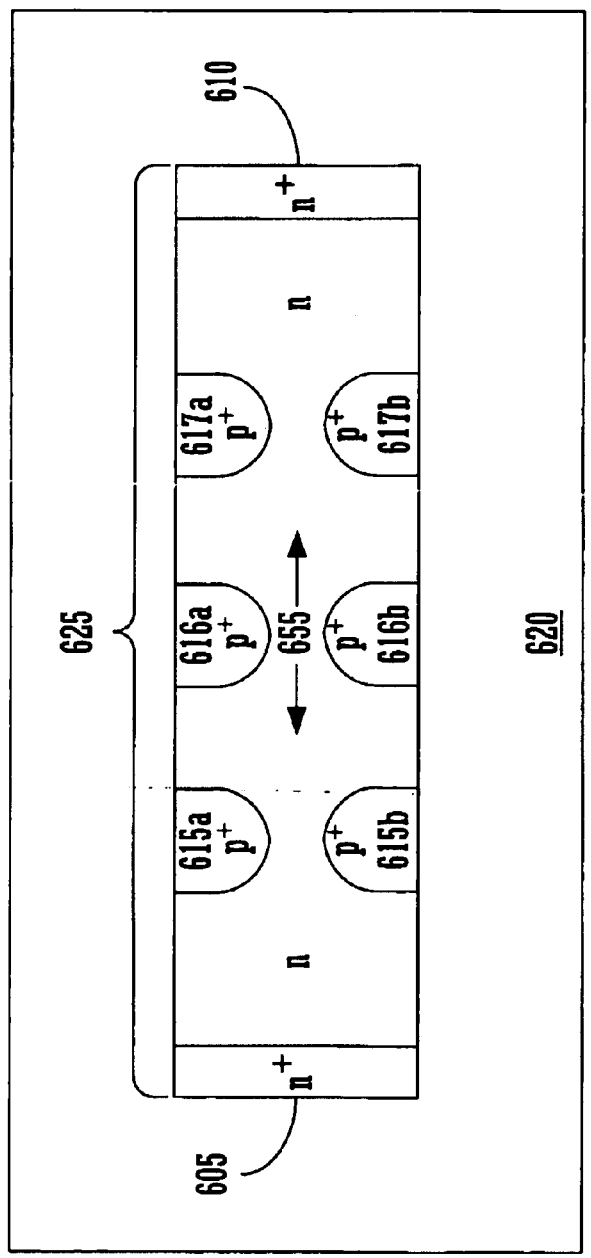
FIG. 6B shows a top view of a horizontal split gate programmable junction field effect transistor (JFET) fabricated on a silicon-on-insulator (SOI) substrate in accordance with an embodiment of the present claimed invention.

FIG. 6B shows a top view of the horizontal split gate programmable junction field effect transistor (JFET) 625 of FIG. 6A. The JFET 625 has three independent gates acting on a channel 655, each gate comprising two opposed gate regions. The first gate comprises gate regions 615a and 615b, the second gate comprises gate regions 616a and 616b, and the third gate comprises gate regions 617a and 617b. Each gate pair is coupled to an independent gate lead in order to be made individually operative, thus the device is represented schematically by FIG. 8.

Figure 7A:
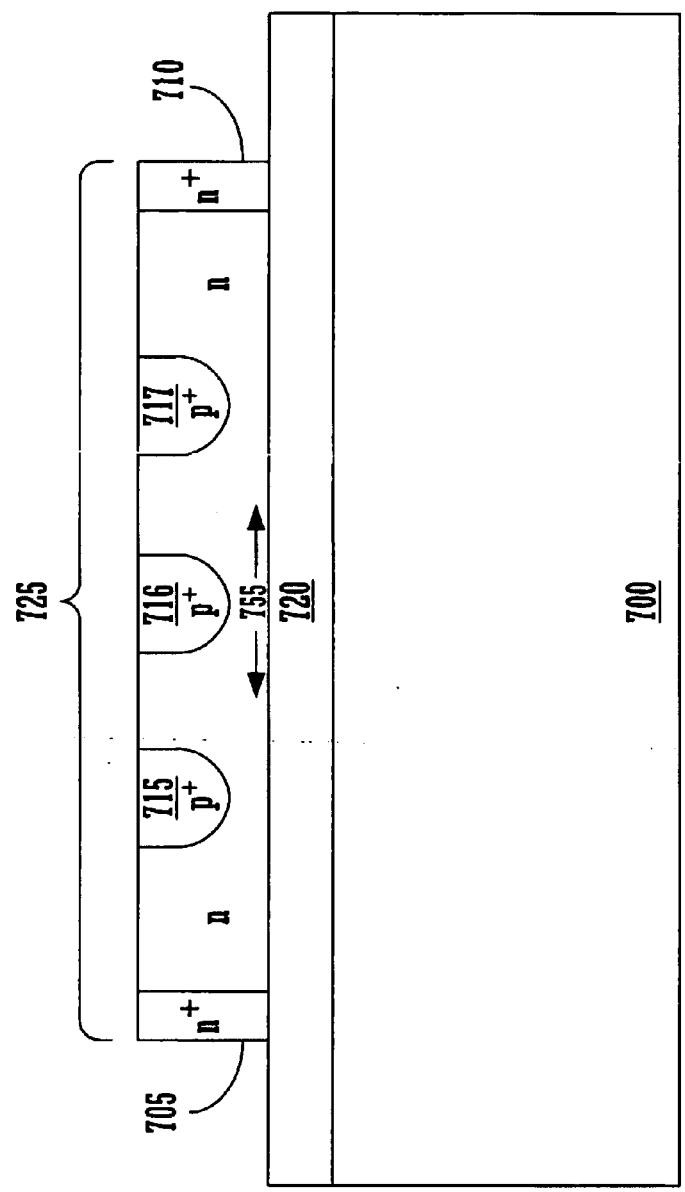
FIG. 7A shows a side view of a vertical gate programmable junction field effect transistor (JFET) fabricated on a silicon-on-insulator (SOI) substrate in accordance with an embodiment of the present claimed invention.

FIG. 7A shows a side view of a vertical gate programmable junction field effect transistor (JFET) 725 fabricated on a silicon-on-insulator (SOI) substrate 700. A dielectric layer 720 electrically isolates the horizontal JFET 725 from the substrate 700. The JFET 725 has a drain 710 and a source 705. The JFET 725 has three gates, each comprising a single gate region. In this device, the channel 755 is defined between the gates and the dielectric layer 720, instead of being defined between gate elements. The device is turned off by biasing a gate (e.g., 715, 716, or 717) such that the depletion region associated with the gate extends to the dielectric layer 720.

Figure 7B:
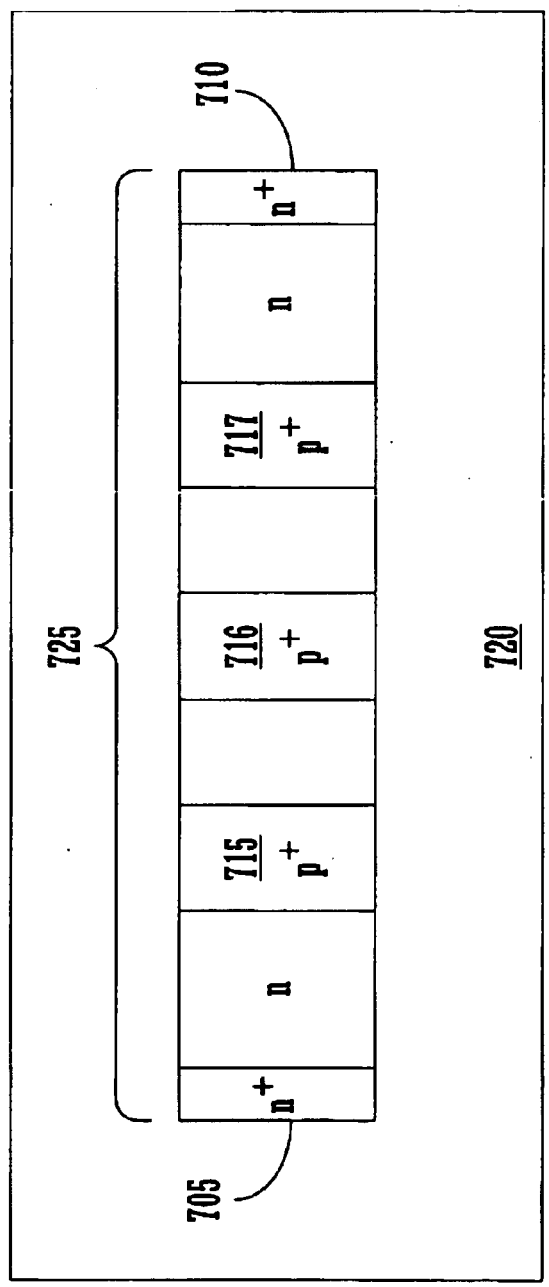
FIG. 7B shows a top view of a vertical gate programmable junction field effect transistor (JFET) fabricated on a silicon-on-insulator (SOI) substrate in accordance with an embodiment of the present claimed invention.

FIG. 7B shows a top view of the vertical gate programmable junction field effect transistor (JFET) 725 of FIG. 7A. Although the horizontal JFETs of FIGS. 6A–B and 7A–B show depict show a horizontal JFET as a mesa structure, the JFET may also be fabricated in a planar substrate by using isolation trenches in place of mesa etching.

FIG. 8 shows a schematic for a programmable junction field effect transistor (JFET) 800 with three electrically independent gate leads. The drain 810 is shown connected to a voltage source $V_{cc}$ while the source 805 is shown connected to ground. The schematic relates to the devices shown in FIGS. 3 through 7. The source and drain designation with respect to the device structure is often arbitrary and interchangeable, with the source designation being given to the terminal connected to ground as shown in FIG. 8.

Each of gates G1, G2, G3, may comprise one or more gate regions; however, each gate has gate input lead (815, 820, 825) that allows for independent control of the JFET 800. In this case, three different voltages $V_1$, $V_2$, and $V_3$ are applied to gates $G_1$, $G_2$, and $G_3$, respectively.

Figure 9:
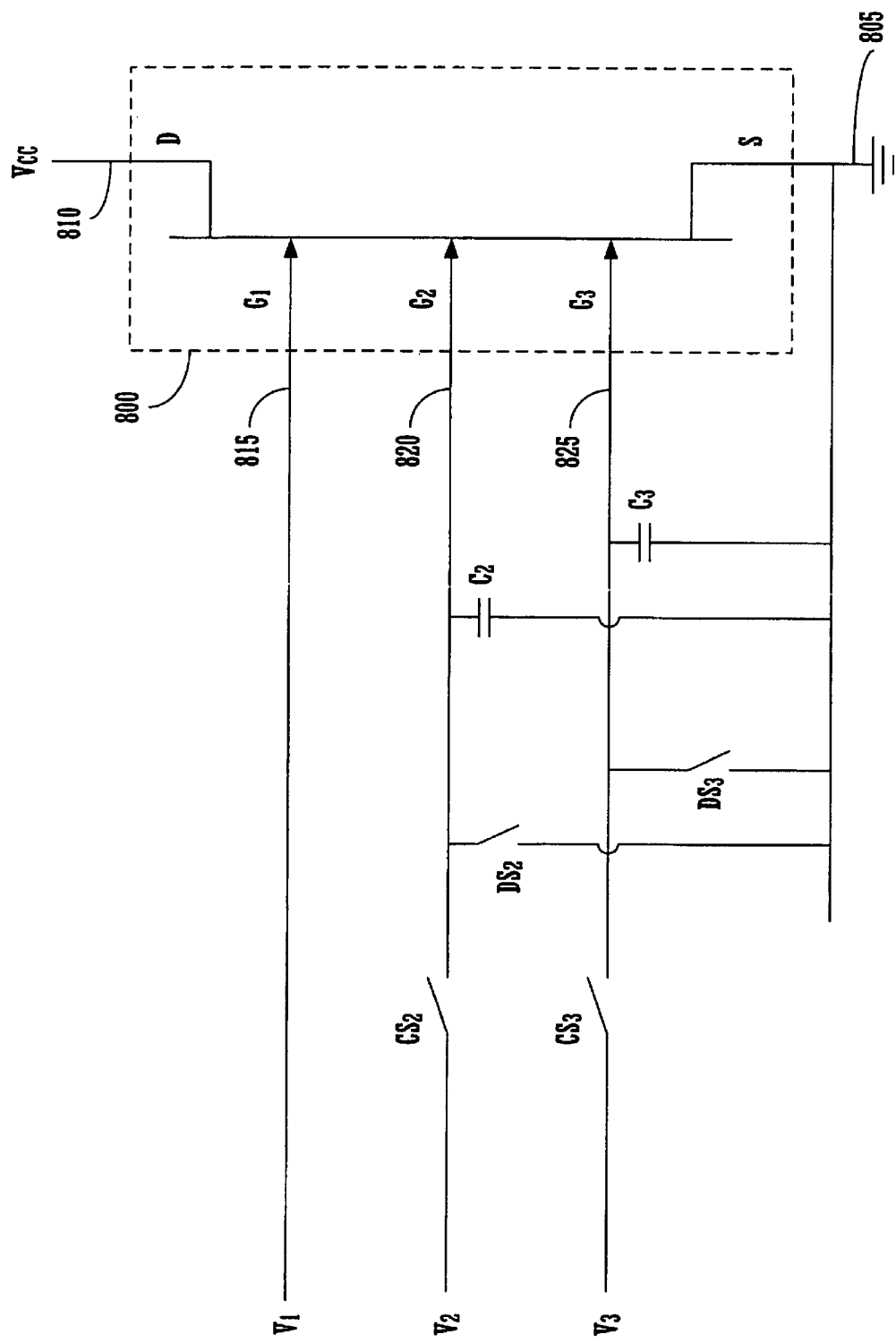
FIG. 9 shows a schematic for a switch network circuit for a programmable junction field effect transistor (JFET) with three electrically independent gate leads in accordance with an embodiment of the present claimed invention.

FIG. 9 shows a schematic for a switch network circuit for the programmable junction field effect transistor (JFET) 800 of FIG. 8. Lead 815 has been selected as the signal input with signal input V, with leads 820 and 825 being programmable. Gate leads 820, and 825 are coupled to voltage sources $V_2$ and $V_3$ by charging, switches $CS_2$ and $CS_3$, respectively.

The charging switches $CS_2$ and $CS_3$ enable programming of the JFET 800 by coupling to a voltage source. Depending upon the leakage characteristics of gates $G_2$ and $G_3$, programming capacitors $C_2$ and $C_3$ may optionally be used to couple the gates to source 805. The programming capacitors $C_2$ and $C_3$ augment the junction capacitance of the gates and help to maintain the programming state when programming switches $CS_2$ and $CS_3$ are open.

when programming capacitors are used, or fixed voltage sources are used for programming, the discharge switches $DS_2$ and $DS_3$ may be used to set the programming voltage to zero. The charging and discharging switches shown in FIG. 9 may be mechanical switches and may also be transistors. The programming voltage sources may be derived from fixed available system voltages, or may be variable and generated specifically for programming.

Figure 10:
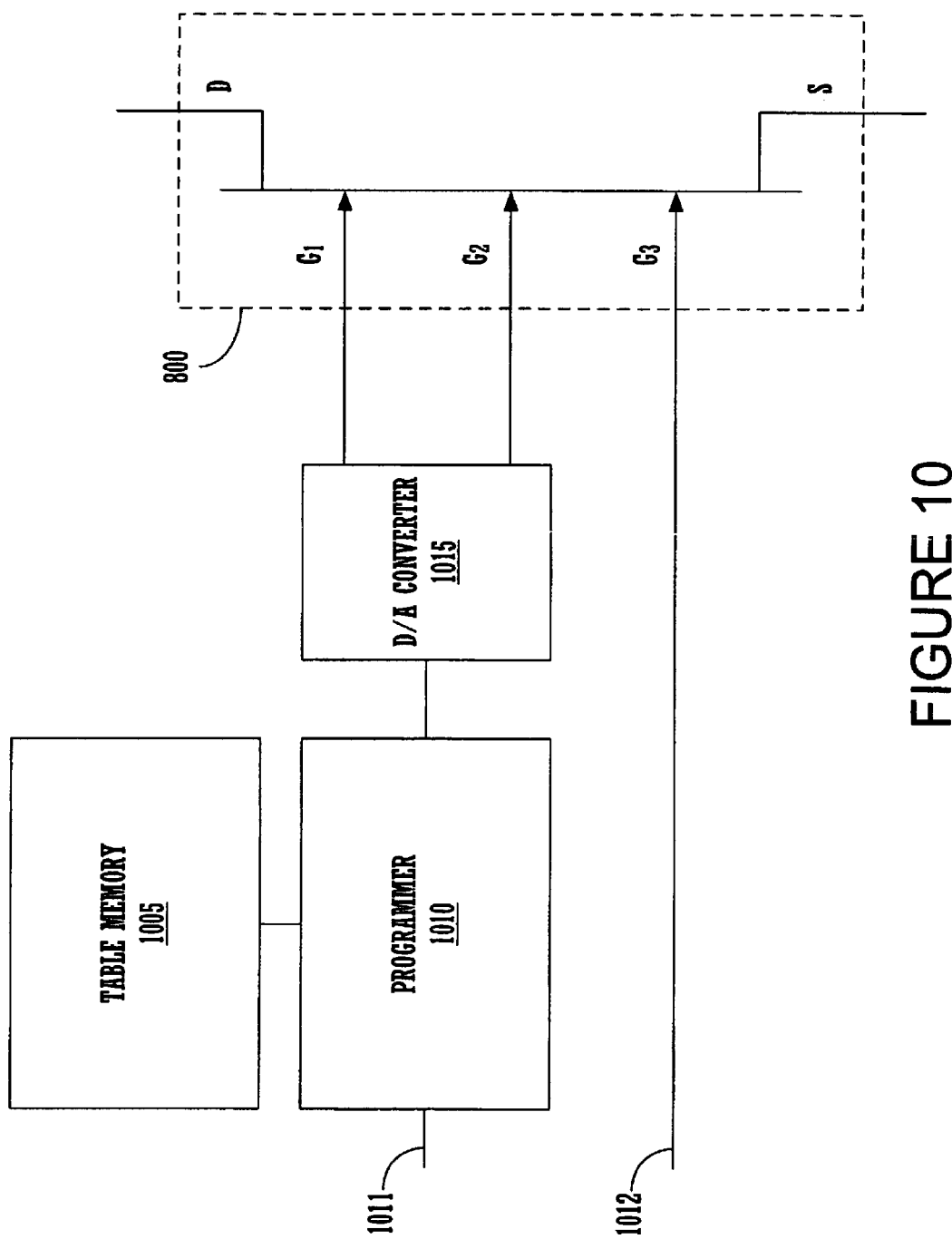
FIG. 10 shows a schematic for a programming circuit 1000 for a programmable junction field effect transistor (JFET) in accordance with an embodiment of the present claimed invention.

FIG. 10 shows a schematic for a programming circuit for a programmable junction field effect transistor (JFET) 800.

Gate $G_3$ has been selected as the signal input 1012, and gates $G_1$ and $G_2$ have been selected as the programming inputs.

An application program access the programmer input 1011 of the programmer 1010 to configure the JFET 800. The programmer 1010 is coupled to a table memory 1005 that stores data that may include mapped parameters or model coefficients. The programmer 1010 uses the data stored in the table memory 1005 to determine the digitally encoded values that are provided to the digital-to-analog (D/A) converter 1015.

The D/A converter 1015 receives a digitally encoded voltage value for gates $G_1$ and $G_2$ as inputs and applies an analog voltage to gates $G_1$ and $G_2$ as outputs.

An application addressing the programmer 1010 provides data that essentially specifies the required characteristics for a single gate JFET. The programmer 1010 uses the data in the table memory 1005 to determine the optimum voltage values to apply to gates $G_1$ and $G_2$ in order to achieve the desired response from the JFET 800. The programmer 1010 may perform a simple table look-up, or may solve an equation or set of equations to determine the optimum voltage values to apply.

Figure 11:
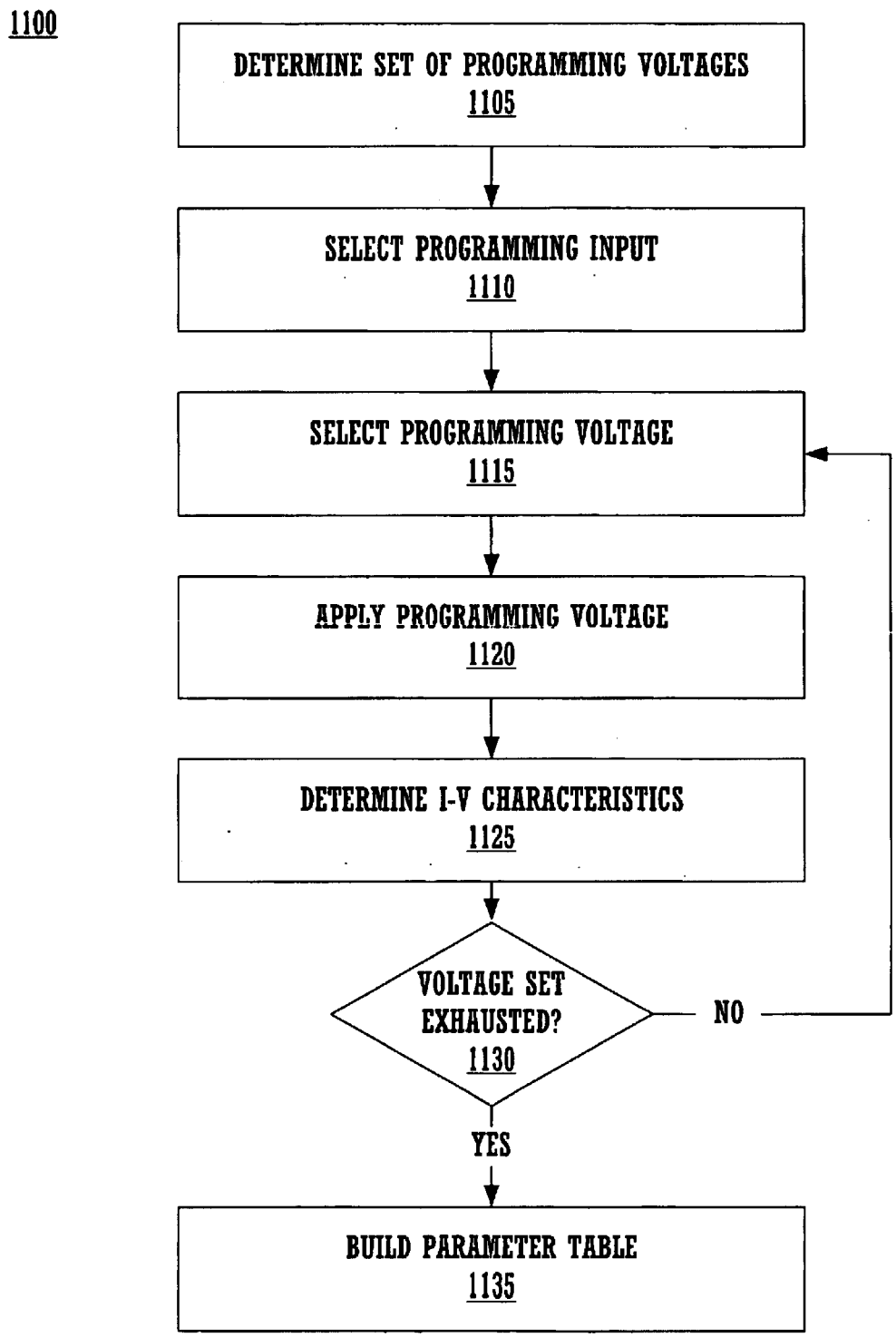
FIG. 11 shows a flow diagram for a method of programming a circuit with a programmable junction field effect transistor (JFET) in accordance with an embodiment of the present claimed invention.

FIG. 11. shows a flow diagram for a method 1100 of programming a circuit with a programmable junction field effect transistor such as that shown in FIG. 10.

In step 1105, a set of programming voltages is determined. The programming voltages may be an arbitrary sequence of voltages covering the operating range of the device, or they may be voltages selected from voltages provided to other system components.

In step 1110, a programming input of the device is selected. The programming input may be any of the available gate inputs on the programmable JFET or it may be selected from a predetermined subset of gate inputs.

In step 1115, a programming voltage is selected from the set of voltages determined in Step 1105. In step 1120, the programming voltage is applied. At this point, the programmable JFET is temporarily fixed as a conventional three terminal JFET for succeeding step 1125.

In step 1125, the current-voltage (I-V) characteristics of the JFET are determined. This step may be performed over a range of signal input voltages and drain-source voltages as is known in the art. After the I-V characteristics have been determined at the selected programming voltage a check is made in Step 1130 to see if every programming voltage has been evaluated. If the voltage set is not exhausted, steps 1115 through 1125 are repeated. If the set is exhausted step 1135 is performed.

In step 1135, a parameter table is built from the I-V characteristics determined at each programming voltage. In a simple form, the parameter table may be a collection of the data produced, mapping the I-V characteristics to their associated programming voltages. In an alternative embodiment, the parameter table may also include model coefficients for a general relationship that describes the behavior of the programmable JFET. The model coefficients may be derived from a least-squares or other curve fitting technique.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims and their equivalents.

What is claimed is:

1. A programmable junction field effect transistor (JFET) comprising:

a substrate;

a drain formed in said substrate;

a source formed in said substrate, wherein a conductive channel exists between said drain and said source;

a first gate region complementary to said substrate, and coupled to a first gate input, wherein said first gate region is operative to control a resistance of said conductive channel by the application of an electric potential between said source and said first gate input; and a second gate region complementary to said substrate, and coupled to a second gate input, wherein said second gate region is operative to control said resistance of said conductive channel by the application of an electric potential between said source and said second gate input, and wherein said first gate input is electrically isolated from said second gate input.

2. The programmable JFET of claim 1, wherein said drain is disposed in a first surface of said substrate and said source is disposed in a second surface of said substrate.

3. The programmable JFET of claim 2, wherein said first gate region and said second gate region are disposed in a surface of a first trench formed in said first surface or said second surface of said substrate.

4. The programmable JFET of claim 3, further comprising a third gate region complementary to said substrate coupled to a third gate input, wherein said third gate region is disposed in a bottom of a trench formed in said first trench.

5. The programmable JFET of claim 1, wherein said drain and said source are disposed on the same surface of said substrate.

6. The programmable JFET of claim 5, further comprising a dielectric layer disposed within said substrate, wherein said dielectric layer is substantially parallel to said same surface of said substrate.

7. The programmable JFET of claim 1, wherein only one of said first gate region and said second gate region is operative to turn the transistor off.

8. The programmable JFET of claim 1, wherein both of said first gate region and said second gate region are operative to turn said transistor off.

9. The programmable JFET of claim 1, wherein said first gate region and said second gate region are operationally equivalent.

10. The programmable JFET of claim 1, further comprising:

a third gate region complementary to said substrate, and coupled to said first gate input, wherein said third gate region is operative to control said resistance of said conductive channel by the application of an electric potential between said source and said first input; and a fourth gate region complementary to said substrate, and coupled to said second gate input, wherein said fourth gate region is operative to control said resistance of said conductive channel by the application of an electric potential between said source and said second gate input.

* * * * *